May 5, 1964 J. C. MUNSON ETAL 3,132,308

AUTOMATIC GAIN CONTROL CIRCUIT

Filed Oct. 26, 1961 2 Sheets-Sheet 1

INVENTORS.
JOHN C. MUNSON
GEORGE W. COPE
BY W. O. Quesenberry
D. E. Hodges
ATTYS.

AUTOMATIC GAIN CONTROL CIRCUIT

Filed Oct. 26, 1961 2 Sheets-Sheet 2

INVENTORS.
JOHN C. MUNSON
GEORGE W. COPE
BY W. O. Quesenberry
D. E. Hodges ATTYS.

United States Patent Office 3,132,308
Patented May 5, 1964

3,132,308
AUTOMATIC GAIN CONTROL CIRCUIT

John C. Munson, Silver Spring, and George W. Cope, Bladensburg, Md., assignors to the United States of America as represented by the Secretary of the Navy Filed Oct. 26, 1961, Ser. No. 147,999
5 Claims. (Cl. 330—144)
(Granted under Title 35, U.S. Code (1952), sec. 266)

The invention described herein may be manufactured and used by or for the Government of the United States of America for governmental purposes without the payment of any royalties thereon or therefor.

This invention relates to an automatic grain control circuit and more particularly to an automatic gain control circuit which is particularly useful to control the level of low frequency signals.

Prior automatic gain circuits, such as those employed in radios, have been concerned with the problem of standardizing the amplitude of an A.-C. signal. These systems usually employ a number of amplifier stages wherein the amplitude of the signal received and amplified is rectified and fed back in D.C. form to the prior stages to control the operating characteristics and thus the gain of these stages. The most common prior automatic gain control systems are those employing variable gain pentodes in the amplifier stages. The negative feedback voltage is used to reduce the plate current in these pentodes and thus control the gain of these stages. Since the signal frequency of the A.C. signal greatly exceeds the frequency of this D.C. shift, the A.C. signal is easily distinguishable from any effects of this shift and the ordinary A.-C. coupling between stages of the amplifier is effective to remove this D.C. shift from the final signal.

The automatic gain control of a very low frequency signal, however, presents certain problems which render the use of the prior A.C. automatic gain control circuits impractical. As the frequency of the signal approaches the frequency of the rate of change of signal amplitude the D.C. shift necessary to control gain becomes indistinguishable from the low frequency signal which is to be amplified. Therefore, there would be no means by which the two signals might be separated, and the signal would be greatly distorted thereby.

The limitations of the former automatic gain control circuits are not unique to the problem of low frequency signals. The problem is encountered at any time that the rate at which the gain is to be controlled approaches the frequency of the incoming signal. When the gain is changing at a frequency approaching the frequency of the incoming signal, the D.C. shift caused by the gain control becomes indistinguishable from the signal frequency, causing excessive distortion therein, and is not removable therefrom by conventional means.

Another problem presented by former automatic gain control systems concerns overloading of the final stages of the amplifier due to a very rapid change of signal level. If the rate of change of the gain followed that of the signal, the resulting D.C. shift would be amplified and cause overloading of the final amplifier stages. This overloading prevents the use of these systems for such rapidly changing signal levels as would be encountered in explosive testing.

One method which was formerly employed to reduce the effect of the D.C. shift was the utilization of certain push-pull arrangements whereby the D.C. shift might be cancelled. These push-pull arrangements, however, required delicate and constant balancing and were found to have insufficient dynamic range for certain applications.

An object of this invention is to provide an automatic gain control circuit wherein the amplitude of an incoming signal may be accurately and rapidly controlled without introducing a D.C. shift into the circuit.

Another object of this invention is to provide an automatic gain control circuit by which the gain of the circuit might be altered at a rate approaching the frequency spectrum of the incoming signal.

A further object of this invention is to provide an automatic gain control circuit which makes possible the automatic control of the amplitude of incoming signals of either the intermittent or the continuously occurring variety without overloading of the amplifier stages.

Various other objects and advantages will be apparent from the following description of one embodiment of the invention, and the novel features will be more clearly pointed out hereinafter in connection with the specification and appended claims taken in connection with the accompanying drawings of which:

Figure 1:
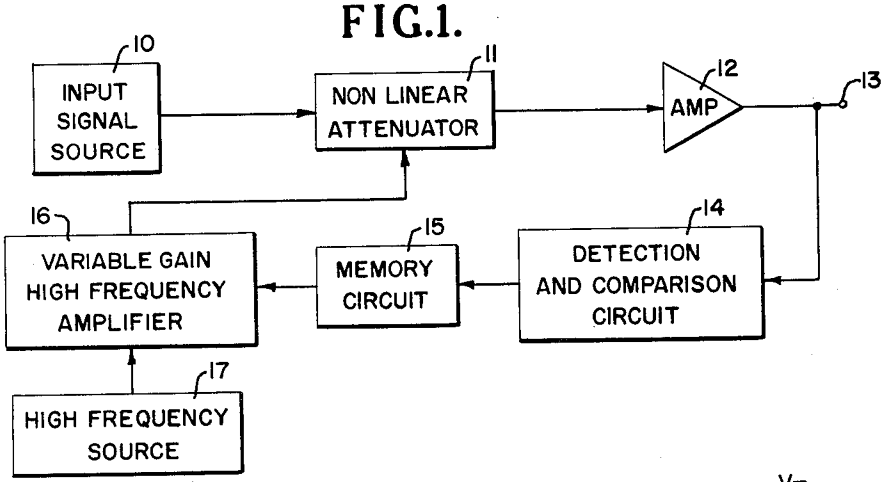
FIG. 1 is a simplified block diagram of the automatic gain control system of the present invention.

In the general embodiment of the invention illustrated in FIG. 1, a low frequency signal of varying amplitude is received from the input signal source 10. The signal is then fed to the non-linear attenuator 11, wherein the amplitude of the signal is controlled. The non-linear attenuator 11 may consist of any attenuating circuit element which is responsive to a high frequency signal to change thereby the amount by which the input signal is attenuated. After the signal has been attenuated, it is amplified to a desired level by a conventional fixed gain amplifier 12, which may comprise a single amplifier or a series of stages of amplification. The output from the amplifier element 12 is connected to an output terminal 13; a portion of this output is then supplied to a feedback circuit to control the level of attenuation of the signal in the non-linear attenuating element 11. The amplitude of the output signal is detected and compared with a reference in a detection and comparison circuit 14. Any well-known method of detecting signal amplitude may be employed herein depending upon the control desired; the most common means employed are such circuits as full or half wave peak or R.M.S. detectors. The comparison of the detected signal amplitude with a fixed reference voltage yields a difference signal output from the circuit 14 which is indicative of the relative amplitude of the amplified signal appearing at the output terminal 13. A memory circuit 15 connected to the output of the detection and comparison circuit 14 then maintains the level of the difference signal applied thereto for a desired period of time. For a continuously occurring signal, this memory circuit will take the form of an averaging circuit, such as a low pass filter, in order that an average indication is maintained over a given number of cycles. The time constant of this memory circuit 15 also determines the speed of response of the automatic gain control; the longer the time constant, the greater the averaging and the slower the speed of response will be.

Figure 5:
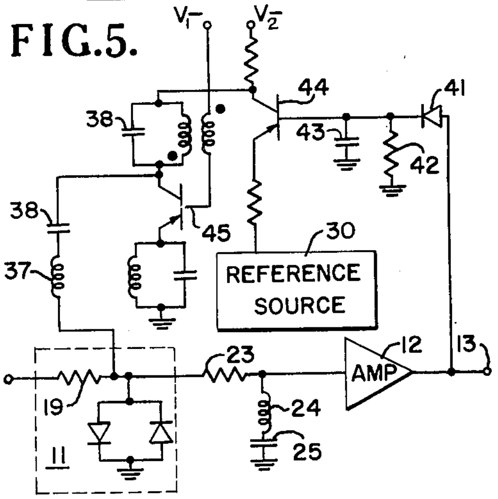
FIG. 5 is a circuit diagram of an embodiment of the invention for the automatic gain control of a continuously occurring signal.

For intermittent signals the memory circuit 15 is actually a hold circuit which will maintain an indication from one cycle until the arrival of the next cycle. This signal level maintained by the memory circuit 15 is then used to control the gain of a high frequency amplifier 16, which amplifies the high frequency control signals from the high frequency source 17; thus the amplitude of the high frequency signals used to control the non-linear attenuator 11 are varied in accordance with the output from the memory circuit 15. In certain circuit arrangements as shown by the embodiment of FIG. 5, the output from the memory circuit 15 may be used directly to control the amplitude of the oscillations of the high frequency source.

In operation, as the level of the signal appearing at the output terminal 13 increases, the amplitude of the D.C. output of the memory circuit 15 will increase; the increased output from the memory circuit is used to increase the gain of the high frequency amplifier 16 and thus raises the amplitude of the high frequency signals supplied to control the non-linear attenuator element 11. The increase of amplitude of the high frequency signals of the non-linear attenuator element 11 reduces the average impedance of a signal shorting leg of the attenuator element 11 and thus the signal from the source 10 reaching the amplifier 12 is reduced in amplitude. Conversely, a decrease of amplitude at the output 13 lowers the gain of the amplifier 16 thus supplying high frequency control signals of lower amplitude to the signal shorting leg of the non-linear attenuator element 11 thus increasing the average resistance thereof, and allowing a greater amount of the signal from source 10 to reach amplifier 12.

Figure 2:
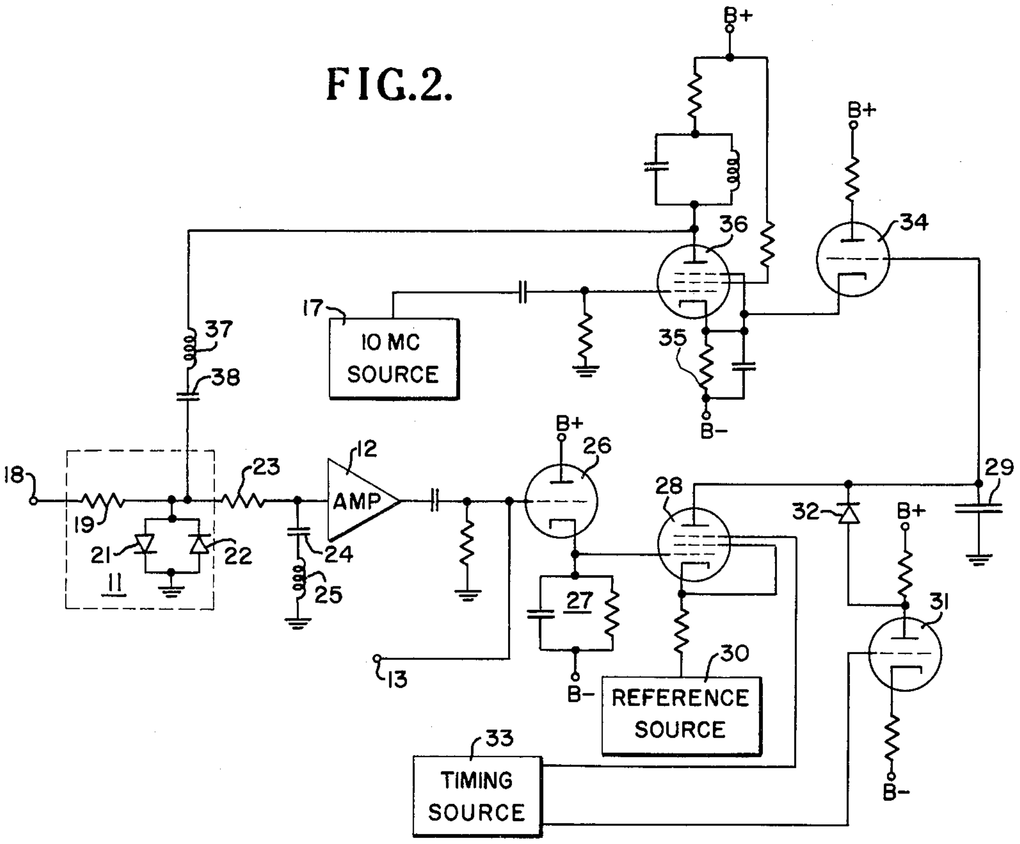
FIG. 2 is a circuit diagram showing one embodiment of the invention for automatic gain control of an intermittent signal.

The basic elements of the circuit are more fully illustrated in the embodiment of FIG. 2, which illustrates a circuit capable of providing automatic gain control for a signal of intermittent character. A low frequency signal of intermittent character is supplied to the input terminal 18 through the resistor 19 to the non-linear attenuator element 11, shown herewith a pair of crystal diodes 21 and 22 connected in opposing parallel relationship comprising the signal shorting leg thereof to shunt the input signals to the ground. After attenuation by attenuator 11, the signals pass to the high frequency trap consisting of resistance 23, and of capacitor 24 and inductance 25 in a series tuned circuit which are tuned to the frequency of the high frequency control signal employed in controlling the impedance of the attenuator 11. The high frequency trap acts to remove the high frequency control signal which has been mixed with the low frequency signal at the attenuator 11. The attenuated low frequency signal is then amplified by the fixed gain amplifier means 12 which supplies the amplified signal to the output terminal 13. The signal from amplifier 12 is also supplied to the peak detector triode 26 and its associated RC circuit 27, which detects the peak amplitude of one cycle of the intermittent signal and maintains an indication of this peak for a time determined by the RC time constant of the RC circuit 27. This peak amplitude is then supplied to the pentode gate 28 at the control grid thereof to control the amount of current flow therethrough when the gate is triggered.

Since the cathode of the pentode gate 28 is connected through a cathode resistor to the reference source 30, the peak amplitude applied to the grid thereof is effectively compared with the amplitude of the reference source 30 since the amount of conduction through tube 28 will be controlled by the voltage difference between the cathode and the grid thereof. The output from the pentode charging gate 28 changes the charge of the capacitor memory element 29 by an amount roughly proportional to the difference between the peak amplitude of the intermittent signal and the reference source. A discharge gate composed of the triode 31 and the uni-directional diode 32 are also connected to the capacitor memory element 29. The discharging gate removes from the integrating capacitor 29 a given amount of charge each time it operates. The difference between the charge removed and the charge added determines a new level of voltage on capacitor 29. A timing source 33 is connected to provide a gating pulse to open both the charging gate 28 and the discharging gate 31 once during each cycle of the intermittent signal. The timing source 33 is operative to deliver these gating pulses to the charging gate 28 and the discharging gate 31 at constant time intervals after the reception of each new cycle of the intermittent signal. The discharging gate 31 may either be operated to remove the charge from the capacitor 29 before or after the operation of the charging gate 28 or may be operated concurrently therewith to remove a fixed charge therefrom while a new charge is being added thereto. The voltage retained on the memory capacitor 29 is then supplied through the buffer triode 34 to the cathode resistance 35 of the high frequency pentode amplifier 36 to control the gain thereof, as is well known in the art. A ten megacycle control signal is connected from the source 17 to the control grid of the pentode amplifier 36 to be amplified thereby. This amplified high frequency control signal is then applied through the series tuned circuit composed of the inductance 37 and the capacitance 38 to the signal shorting leg of the non-linear attenuator 11 to control the average resistance thereof.

Figure 3:
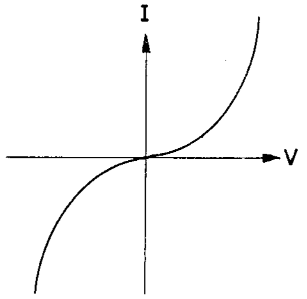
FIG. 3 is a graph which illustrates the operating characteristics of the non-linear attenuator.
Figure 4:
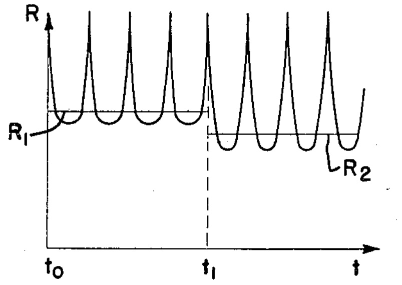
FIG. 4 is a wave form diagram illustrating the operation of the circuit of FIG. 2.

The operation of the non-linear attenuator element 11 may best be described with reference to FIGS. 3 and 4. FIG. 3 shows the response curve of the pair of diodes connected in opposing parallel relation. The portion of the curve to the right of the zero axis, as illustrated, represents the voltage-to-current response of the diode 21, while the portion to the left represents the voltage-to-current response of the diode 22. FIG. 4 shows the effect of the application of a high frequency signal to such a signal shorting leg of the non-linear attenuator. When a high frequency signal of a first amplitude from the high frequency amplifier 36 is applied to the signal shorting element of the attenuator 11, a first average resistance is established as indicated by $R_1$ in FIG. 4. When this high frequency signal is increased in amplitude, the resistance of each of the diodes makes increased excursions into areas of lower resistance thereby causing the average resistance of the signal shorting element of the attenuator 11 to be decreased, as illustrated by $R_2$. Thus the average resistance of the signal shorting element of the attenuator is controlled by the amplitude of a high frequency current supplied thereto.

It is to be noted at this point that the non-linear response of the attenuator element 11 refers to its non-linear response of the signal shorting leg to the voltage excursions of the high frequency control signal. The input signal from the source 10 will be of a substantially lower frequency and a very much lower amplitude; therefore, the input signal will not effect the resistance of the attenuator and will see the resistance of the signal shorting leg of the attenuator element as a linear resistance having an ohmic value equal to the average resistance established by the high frequency control signal. The division ratio of the attenuator, that is the ratio between the resistance of the signal shorting leg and of the sum of that and of the resistor 19, remains constant for the period of one cycle of the intermittent signal. Thus the gain is not changing during the reception of the signal, but is definitely established beforehand.

In summary, the operation of the circuit of FIG. 2 may be described as follows. The intermittent low frequency signal is attenuated by the non-linear attenuator 11 according to the amplitude of the high frequency control signal received from the amplifier 36. The attenuated signal, with the high frequency control signal now mixed therewith, is supplied to the high frequency trap wherein the high frequency control signal is removed. The attenuated low frequency signal is then amplified by the amplifier 12 and the peak thereof is sensed by a peak detector and used to control the conduction of the pentode charging gate 28. A pair of timing signals are received from the timing source 33 to operate the charging and the discharging gates. The negative gate signal from the timing source 33 cuts off the triode 31 thus allowing the diode 32 to conduct and drain a specified portion of the negative charge of the integrating capacitor 29. A positive gate pulse supplied from timing source 33 to the charging gate 28 permits conduction thereof thus charging the integrating capacitor 29 to level proportional to the difference between the peak amplitude of the detected signal. The voltage level then existing on the capacitor 29 is applied through the buffer stage 34 to control the bias on the high frequency amplifier 36. Thus the higher the negative charge on the integrating capacitor 29 the higher the amplitude of the ten megacycle control signal supplied to the non-linear attenuator element 11. As the amplitude of the high frequency control signal increases the resistance of the signal shorting leg of the attenuator element is decreased thus lowering the amplitude of the low frequency signal reaching the amplifier element 12 and the output 13. Thus the level of the intermittent signal is automatically controlled.

FIG. 5 illustrates an embodiment of the invention similar to that of FIG. 2, which is employed in furnishing automatic gain control for a continuously received signal. In the illustrated embodiment of the invention of FIG. 5, it is to be noted that transistors are employed therein. Throughout the different embodiments illustrated herein various well-known transistor or vacuum tube circuits of similar operation may be employed therein while not departing from the scope of the invention. In this embodiment, the output of the amplifier 12 is fed back through the diode rectifier 41 to the shunting resistance 42 and shunting capacitor 43 which perform the function of a low pass filter and a peak deflector; the capacitor 43 maintains the level of the detector signal according to the RC time constant of the circuit. The amplitude of the signal is fed to the base of the buffer stage transistor 44 and then is used to control the amplitude of the oscillations of the high frequency transistor oscillator 45. In this case it is to be noted that the amplitude of the control signal is controlled directly by applying the feedback signal directly to the high frequency source instead of, as in FIG. 2, controlling the gain of a high frequency amplifier which amplifies the high frequency signal. The control signals are applied through the series tuned circuit of the capacitor 38 and inductance 39 as before, to control the attenuation of the low frequency signal by the non-linear attenuator element 11.

Figure 6:
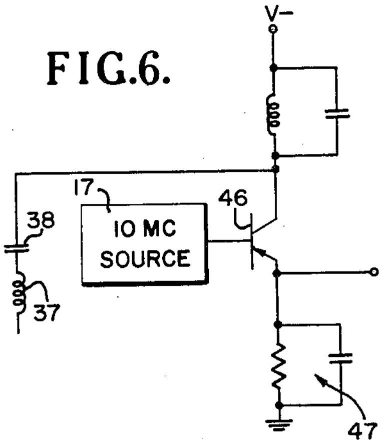
FIG. 6 is a circuit diagram of an alternative transistor circuit which may be used in place of the control signal circuit illustrated in FIG. 5.

FIG. 6 shows an alternative form of a circuit for varying the amplitude of a high frequency signal which may be employed herein. In this case the negative D.C. signal, corresponding to the level of the low frequency signal at the output, is applied to bias the emitter of the high frequency transistor 46 by applying the signal to the emitter bias circuit 47. The ten megacycle control signal source is connected to the base of the high frequency transistor to be amplified thereby. In operation, the amplitude of the signal used to bias the emitter of the transistor 46 determines the portion of the cycle of the high frequency signal during which the transistor 46 is conducting. In this way the amplitude of the ten megacycle source signal 17 through capacitor 38 and inductance 37 to the non-linear attenuator element 11 is effectively controlled according to the amplitude of the output signal. The operation of the circuit is analogous to that of a class C amplifier wih variable bias.

Figure 7:
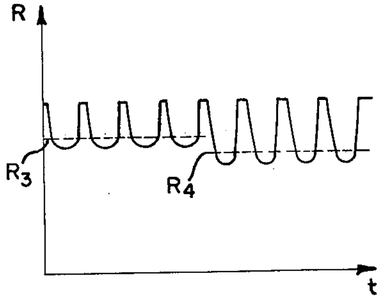
FIG. 7 is a wave form diagram illustrating the operation of the invention when the circuit of FIG. 6 is employed therein.

FIG. 7 shows the wave form of the effect of a change in signal amplitude of the high frequency control signal from the circuit shown in FIG. 6. As the ten megacycle control signal amplitude is increased by varying the bias from a first level to a second level the average resistance of the non-linear amplifier attenuator changes from a first value $R_3$ to a lower average resistance $R_4$.

In each of the embodiments of the instant invention, the automatic control of the gain of the circuit is accomplished without the need of introducing spurious signals into the amplifier which might cause distortion in the output thereof. The control of gain is accomplished by a symmetrical A.C. signal rather than by a change in D.C. as before so that no D.C. is introduced into the amplifier. It is also to be noted that the gain of the amplifier itself is not affected thereby, thus removing the possibility of overloading of the amplifier stages from too rapid a change in the gain; thus the system is able to provide gain control at a rate approaching the frequency spectrum of the incoming signal. It should also be noted that the system requires that the frequency of the control signal be substantially different from the frequency of any incoming signal so that the two may be easily separated.

The signal shorting leg of the non-linear attenuator element 11 is not confined to the opposing parallel diode arrangement shown in each embodiment of the invention. Other well-known circuit elements having the desired speed of response may be used in lieu thereof by those having ordinary skill in the art without departing from the scope of the invention. For example, the pair of diodes comprising the signal shorting leg of the attenuator element might be replaced with a thermistor element with the amplified signal being fed back to control a heating element adjacent the thermistor; however such an arrangement would have a very slow speed of response in adjusting the gain due to the very slow speed of the thermal element.

It will be understood that various changes in the details, materials and arrangements of parts which have been herein described and illustrated in order to explain the nature of the invention, may be made by those skilled in the art within the principle and scope of the invention as expressed in the appended claims.

What is claimed as new and desired to be secured by Letters Patent of the United States is:

1. An automatic gain control circuit for controlling the amplitude of a series of intermittent input signals comprising in combination, a variable impedance means for receiving and atttenuating the intermittent input signals, peak detecting means having an input connected to said impedance means for detecting the peak amplitude of the intermittent signals, storage means connected to an output of said detecting means for maintaining an indication of said peak amplitude until the reception of the succeeding intermittent signal having, an integrating capacitor for storing the charge during the period between the intermittent signals, a charging gate means connected between said peak detecting means and said capacitor for charging said capacitor by an amount proportional to the difference between the peak amplitude of the preceding signal and a fixed reference voltage, a discharging gate means connected to said capacitor for discharging a fixed charge from said capacitor.

and a timing means connected to said charging gate means and said discharging gate means for sequentially operating said charging gate means for charging said capacitor and said discharging gate means for discharging said capacitor, and control means connected between said capacitor and said variable impedance means for developing an output control signal of high frequency to vary the impedance of said variable impedance means in accordance with the amplitude of the charge stored on said capacitor.

2. Apparatus as recited in claim 1 wherein said variable impedance means comprises a pair of diodes connected in opposing parallel relationship for attenuating the intermittent signals by varying their impedance in accordance with the high frequency control signal.

3. Apparatus as recited in claim 2 further comprising a high frequency trap means connected to said variable impedance means and said peak detecting means for removing said high frequency control signals from the intermittent signals after the intermittent signals have been attenuated by said variable impedance means.

4. Apparatus as recited in claim 3 wherein said control means comprises a high frequency amplifier having a gain determined by the amplitude of the charge stored on said capacitor.

5. A signal amplifier with an automatic gain control circuit controlling the amplitude of input signals of a first frequency range comprising in combination, a non-linear attenuator responsive to high frequency control signals for receiving and attenuating the amplitude of the input signals, high frequency trap means connected to said non-linear attenuator for removing said high frequency control signals from the attenuated input signals after the input signals have been attenuated, an output terminal connected to said non-linear attenuator for receiving the attenuated input signals, peak detecting means having an input connected to said non-linear attenuator for detecting the peak amplitude of the attenuated input signals, a charging gate means having an input connected to an output of said peak detecting means for supplying an output voltage proportional to the difference between the peak amplitude of the input signal and a fixed reference voltage, an integrating capacitor connected to an output of said charging gate means for storing a charge proportional to the output voltage of said charging gate means, a discharging gate means connected to said capacitor for discharging a fixed charge from said capacitor, a timing means connected to said charging gate means and said discharging gate means for sequentially operating both said charging gate means for charging said capacitor and said discharging gate means for discharging said capacitor, and control means connected between said capacitor and said non-linear attenuator for developing an output signal of high frequency to vary the impedance of said non-linear attenuator in accordance with the amplitude of the charge stored on said capacitor.

References Cited in the file of this patent

UNITED STATES PATENTS

| | | |
|---|---|---|
| 2,279,128 | Paslay | Apr. 7, 1942 |
| 2,609,443 | Avins | Sept. 2, 1952 |